(12) United States Patent
Shiraishi (10) Patent No.: US 8,338,944 B2
(45) Date of Patent: Dec. 25, 2012

(54) SEMICONDUCTOR DEVICE, SEMICONDUCTOR MODULE, RADIATING FIN AND FITTING PORTIONS

(75) Inventor: Takuya Shiraishi, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 398 days.

(21) Appl. No.: 12/623,731

(22) Filed: Nov. 23, 2009

(65) Prior Publication Data

US 2010/0244237 A1    Sep. 30, 2010

(30) Foreign Application Priority Data

Mar. 26, 2009  (JP) ................ 2009-077041

(51) Int. Cl.
*H01L 23/10* (2006.01)
*H01L 23/34* (2006.01)

(52) U.S. Cl. ........ 257/718; 257/706; 257/707; 257/719; 257/722; 257/727; 257/E23.084

(58) Field of Classification Search ............... 257/706, 257/707, 718, 719, 722, 727, E23.084
See application file for complete search history.

(56) References Cited

U.S. PATENT DOCUMENTS

| 5,603,374 | A | * | 2/1997 | Wu | 165/80.3 |
| 2004/0040327 | A1 | * | 3/2004 | Iida et al. | 62/259.2 |
| 2008/0203559 | A1 | * | 8/2008 | Lee et al. | 257/718 |

FOREIGN PATENT DOCUMENTS

| JP | 63-93659 | 6/1988 |
| JP | 02244661 A * | 9/1990 |
| JP | 4-275452 | 10/1992 |
| JP | 5-206345 | 8/1993 |
| JP | 6-268086 | 9/1994 |
| JP | 6-72247 | 10/1994 |
| JP | 7-13234 | 3/1995 |
| JP | 10-144968 | 5/1998 |
| JP | 2003-23280 | 1/2003 |
| JP | 2006-190972 | 7/2006 |
| JP | 2008172146 A * | 7/2008 |

OTHER PUBLICATIONS

Office Action issued Sep. 7, 2011, in Chinese Patent Application No. 201010127752.6 (with English-language translation).
Office Action issued Jun. 19, 2012 in Japanese Patent Application No. 2009-077041 (with English translation of the text of Office Action).

* cited by examiner

Primary Examiner — Teresa M. Arroyo
(74) Attorney, Agent, or Firm — Oblon, Spivak, McClelland, Maier & Neustadt, L.L.P.

(57) ABSTRACT

A semiconductor device includes a semiconductor module that has a joint surface, a first fitting portion and a second fitting portion provided on the joint surface of the semiconductor module, the second fitting portion having a shape different from the first fitting portion; and a radiating fin that has a joint surface, a third fitting portion and a fourth fitting portion provided on the joint surface of the radiating fin, the fourth fitting portion having a shape different from the third fitting portion. The semiconductor module is bonded to the radiating fin so that the first fitting portion is fitted into the third fitting portion or the third fitting portion is fitted into the first fitting portion, and the second fitting portion is fitted into the fourth fitting portion or the fourth fitting portion is fitted into the second fitting portion.

13 Claims, 6 Drawing Sheets

SEMICONDUCTOR DEVICE, SEMICONDUCTOR MODULE, RADIATING FIN AND FITTING PORTIONS

BACKGROUND OF THE INVENTION

1. Field of the Invention

The present invention relates to a semiconductor device, and more particularly to a semiconductor device having a configuration that prevents a semiconductor module from being fixed to a radiating fin in a state where rotating 180 degrees with respect to the correct position, and prevents a reduction in the dielectric strength of the semiconductor module. The present invention also relates to a method for manufacturing the semiconductor device.

2. Background Art

Conventionally, as a semiconductor device having a structure in which a semiconductor module is fixed to a radiating fin, there is known a semiconductor device having a structure in which the semiconductor module has a concavo-convex structure provided on its joint surface to improves a heat radiation characteristic of the semiconductor module (for example, see Patent Document 1). In the device, a concavo-convex structure is also provided on a joint surface of the radiating fin, and the semiconductor module is bonded to and fixed to the radiating fin so that the concavo-convex structure of the semiconductor module is fitted into the concavo-convex structure of the radiating fin.

[Patent Document 1] Japanese Utility Model Laid-Open No. Hei 06-72247

In the above-described semiconductor device, when the semiconductor module rotates 180 degrees with respect to the correct position to the radiating fin, the concavo-convex structure provided on the joint surface of the semiconductor module is fitted into the concavo-convex structure provided on the joint surface of the radiating fin. The semiconductor module may be fixed to the radiating fin in a state where rotating 180 degrees with respect to the correct position.

The insulating layer surrounding semiconductor elements in the semiconductor module gets thinner by providing the concavo-convex structure on the joint surface of the semiconductor module. Thereby, the dielectric strength of the semiconductor module may be lowered.

SUMMARY OF THE INVENTION

In view of the above-described problem, an object of the present invention is to provide a semiconductor device having a configuration that prevents a semiconductor module from being fixed to a radiating fin in a state where rotating 180 degrees with respect to the correct position, and prevents a reduction in the dielectric strength of the semiconductor module. Another object of the invention is to provide a method for manufacturing the semiconductor device.

According to one aspect of the present invention, a semiconductor device includes a semiconductor module and a radiating fin. The semiconductor module that has a joint surface, a first fitting portion and a second fitting portion provided on the joint surface. The second fitting portion has a shape different from the first fitting portion. The radiating fin has a joint surface, a third fitting portion and a fourth fitting portion provided on the joint surface. The fourth fitting portion having a shape different from the third fitting portion. The semiconductor module is bonded to the radiating fin so that the first fitting portion is fitting into the third fitting portion or the third fitting portion is fitting into the first fitting portion, and the second fitting portion is fitting into the fourth fitting portion or the fourth fitting portion is fitting into the second fitting portion. The semiconductor module is fixed to the radiating fin by driving a screw penetrating the joint surfaces of the semiconductor module and the radiating fin. The first fitting portion has a shape not to fit into the fourth fitting portion and the fourth fitting portion has a shape not to fit into the first fitting portion. The second fitting portion has a shape not to fit into the third fitting portion and the third fitting portion has a shape not to fit into the second fitting portion.

According to another aspect of the present invention, a semiconductor device includes a semiconductor module and a radiating fin. The semiconductor module has a joint surface, a first fitting portion and a second fitting portion provided on the joint surface. The radiating fin has a joint surface, a third fitting portion and a fourth fitting portion provided on the joint surface. The semiconductor module is bonded to the radiating fin so that the first fitting portion is fitting into the third fitting portion or the third fitting portion is fitting into the first fitting portion, and the second fitting portion is fitting into the fourth fitting portion or the fourth fitting portion is fitting into the second fitting portion. The semiconductor module is fixed to the radiating fin by driving a screw penetrating the joint surfaces of the first fitting portion and the third fitting portion, and a screw penetrating the joint surfaces of the second fitting portion and the fourth fitting portion.

According to another aspect of the present invention, a method for manufacturing a semiconductor device includes the steps of described below. One of the steps is manufacturing a semiconductor module that has a joint surface, a first fitting portion and a second fitting portion provided on the joint surface. The second fitting portion has a shape different the first fitting portion. Another of the steps is manufacturing a radiating fin that has a joint surface, a third fitting portion and a fourth fitting portion provided on the joint surface. The fourth fitting portion has a shape different from the third fitting portion. Another of the steps is bonding the semiconductor module to the radiating fin so that the first fitting portion is fitting into the third fitting portion or the third fitting portion is fitting into the first fitting portion, and the second fitting portion is fitting into the fourth fitting portion or the fourth fitting portion is fitting into the second fitting portion. Another of the steps is fixing the semiconductor module to the radiating fin by driving a screw penetrating the joint surfaces of the semiconductor module and the radiating fin after bonding the semiconductor module to the radiating fin. The first fitting portion is formed into a shape not to fit into the fourth fitting portion and the fourth fitting portion is formed into a shape not to fit into the first fitting portion. The second fitting portion is formed into a shape not to fit into the third fitting portion and the third fitting portion is formed into a shape not to fit into the second fitting portion.

According to another aspect of the present invention, a method for manufacturing a semiconductor device includes the steps of described below. One of the steps is manufacturing a semiconductor module that has a joint surface, a first fitting portion and a second fitting portion provided on the joint surface. Another of the steps is manufacturing a radiating fin that has a joint surface, a third fitting portion and a fourth fitting portion provided on the joint surface. Another of the steps is bonding the semiconductor module to the radiating fin so that the first fitting portion is fitting into the third fitting portion or the third fitting portion is fitting into the first fitting portion, and the second fitting portion is fitting into the fourth fitting portion or the fourth fitting portion is fitting into the second fitting portion. Another of the steps is fixing the semiconductor module to the radiating fin by driving a screw penetrating the joint surfaces of the first fitting portion and the third fitting portion, and a screw penetrating the joint surfaces of the second fitting portion and the fourth fitting portion after bonding the semiconductor module to the radiating fin.

Other objects and further features of the present invention will be apparent from the following detailed description when read in conjunction with the accompanying drawings.

DETAILED DESCRIPTION OF THE PREFERRED EMBODIMENTS

Now, embodiments of the present invention will be described with reference to the drawings. Like reference numerals denote like components throughout the drawings, and redundant descriptions will be omitted.

First Embodiment

Figure 1:
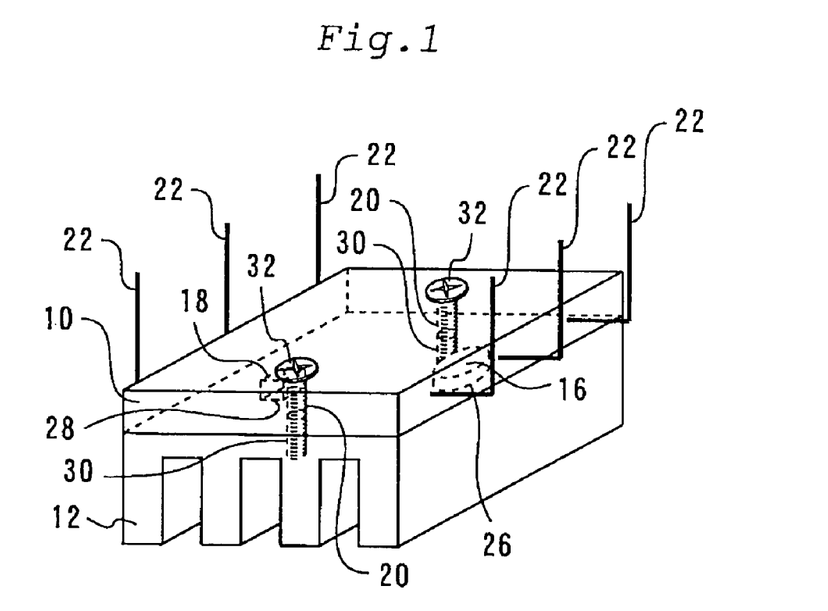
FIG. 1 is a perspective view of a semiconductor device according to a first embodiment.
Figure 2:
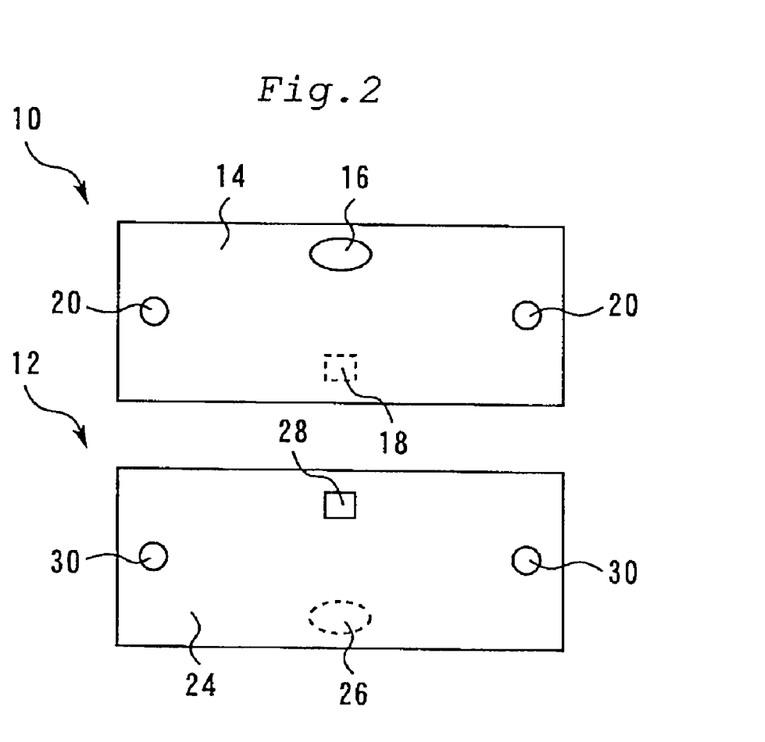
FIG. 2 is a plan view of joint surfaces of a semiconductor module and a radiating fin according to a first embodiment.
Figure 3:
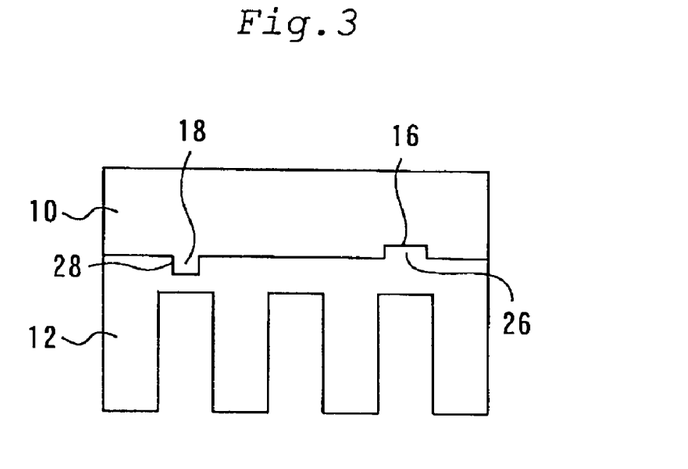
FIG. 3 is a cross-sectional view of a fitting portion of a semiconductor module and a radiating fin according to a first embodiment.

A configuration of a semiconductor device according to a first embodiment will now be described. FIG. 1 is a perspective view of a semiconductor device according to the first embodiment. FIG. 2 is a plan view of joint surfaces of a semiconductor module and a radiating fin according to the first embodiment. FIG. 3 is a cross-sectional view of a fitting portion of a semiconductor module and a radiating fin according to the first embodiment.

The semiconductor device according to the present embodiment comprises a semiconductor module 10 and a radiating fin 12. On a joint surface 14 of the semiconductor module 10, a concave columnar form fitting portion (a first fitting portion) 16 and a convex quadrangular prism form fitting portion (a second fitting portion) 18 are provided. At both ends of the semiconductor module 10, a screw hole 20 is provided. In both side faces of the semiconductor module 10, a plurality of leads 22 are provided.

On the other hand, a convex columnar form fitting portion (a third fitting portion) 26 and a concave quadrangular prism form fitting portion (a forth fitting portion) 28 are provided on a joint surface 24 of the radiating fin 12. The convex columnar form fitting portion 26 has a shape to fit into the concave columnar form fitting portion 16 of the semiconductor module 10, not to fit into the convex quadrangular prism form fitting portion 18 of the semiconductor module 10. The concave quadrangular prism form fitting portion 28 has a shape to fit into the convex quadrangular prism form fitting portion 18 of the semiconductor module 10, not to fit into the concave columnar form fitting portion 16 of the semiconductor module 10. At both ends of the radiating fin 12, a screw hole 30 corresponding to the above-described the screw hole 20 of the semiconductor module 10 is provided.

In the semiconductor device according to the present embodiment, the semiconductor module 10 is bonded to the radiating fin 12 so that the concave columnar form fitting portion 16 and the convex quadrangular prism form fitting portion 18 of the semiconductor module 10 are fitted into the convex columnar form fitting portion 26 and the concave quadrangular prism form fitting portion 28 of the radiating fin 12, respectively. Silicone grease (not shown) is applied to the joint surface 24 of the radiating fin 12, the semiconductor module 10 is adhered to the radiating fin 12 with silicone grease.

Additionally, the semiconductor module 10 is fixed to the radiating fin 12 by driving a screw 32 penetrating both the screw hole 20 of the semiconductor module 10 and the screw hole 30 of the radiating fin 12.

Figure 4:
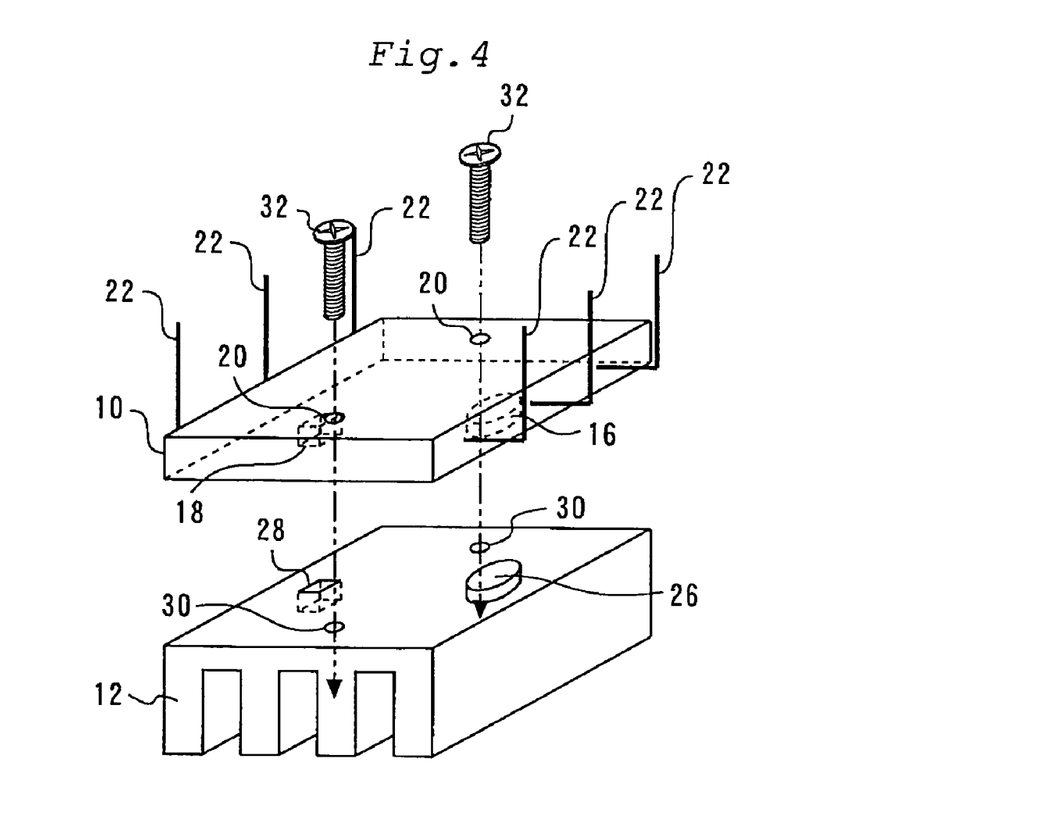
FIG. 4 is a perspective view of features of a method for manufacturing a semiconductor device according to a first embodiment.

A method for manufacturing a semiconductor device according to the first embodiment will now be described. FIG. 4 is a perspective view of features of a method for manufacturing a semiconductor device according to a first embodiment.

First, as shown in FIG. 2, a semiconductor module 10 that has a joint surface 14 is manufactured, a concave columnar form fitting portion (a first fitting portion) 16 and a convex quadrangular prism form fitting portion (a second fitting portion) 18 are provided on the joint surface 14. Then, a radiating fin 12 that has a joint surface 24 is manufactured. A convex columnar form fitting portion (a third fitting portion) 26 and a concave quadrangular prism form fitting portion (a forth fitting portion) 28 are provided on the joint surface 24.

Next, Silicon grease (not shown) is applied to the joint surface 24 of the radiating fin 12. Next, as shown in FIG. 4, the semiconductor module 10 is bonded to the radiating fin 12 so that the concave columnar form fitting portion 16 and the convex quadrangular prism formfitting portion 18 of the semiconductor module 10 are fitted into the convex columnar form fitting portion 26 and the concave quadrangular prism form fitting portion 28 of the radiating fin 12, respectively. Thereby the semiconductor module 10 is adhered to the radiating fin 12 with silicone grease.

Next, the screw 32 penetrating both the screw hole 20 of the semiconductor module 10 and the screw hole 30 of the radiating fin 12 is tightened. Thereby the semiconductor module 20 is fixed to the radiating fin 12.

Advantages of the present embodiment will now be described.

The two fitting portions of the semiconductor module 10 (the concave columnar form fitting portion 16 and the convex quadrangular prism form fitting portion 18) are different from each other in shape. The two fitting portions of the radiating fin 12 (the convex columnar form fitting portion 26 and the concave quadrangular prism form fitting portion 28) are different from each other in shape. Therefore, when the semiconductor module 10 is fixed to the radiating fin 12, the concave columnar form fitting portion 16 of the semiconductor module 10 have to be fitted into the convex columnar form fitting portion 26 of the radiating fin 12 and the convex quadrangular prism form fitting portion 18 of the semiconductor module 10 have to be fitted into the concave quadrangular prism form fitting portion 28 of the radiating fin 12. This prevents the semiconductor module 10 from being fixed to the radiating fin 12 in a state where rotating 180 degrees with respect to the correct position.

Additionally, when the semiconductor module 10 is fixed to the radiating fin 12, the screw 32 is tightened while the fitting portions of the semiconductor module 10 are fitted into the fitting portions of the radiating fin 12. Thereby even if the force to tighten the screw 32 is applied to the semiconductor module 10 and the radiating fin 12, the position of the semiconductor module 10 to the radiating fin 12 is prevented from moving since these fitting portions achieve a role of a stopper.

In the present embodiment, the concave columnar form fitting portion 16 and the convex quadrangular prism form fitting portion 18 are provided on the semiconductor module 10 side, the convex columnar form fitting portion 26 and the concave quadrangular prism form fitting portion 28 are provided on the radiating fin 12 side. However the shapes of the fitting portions provided on the semiconductor module 10 side and the radiating fin 12 side are not limited to these shapes.

The shapes of the two fitting portions provided on the semiconductor module 10 side may be modified, providing that the shapes of these fitting portions differ from each other and these fitting portions fit into the two fitting portions of the radiating fin 12, respectively. In this case, the effect equivalent to that of the present embodiment can be obtained.

Second Embodiment

Figure 5:
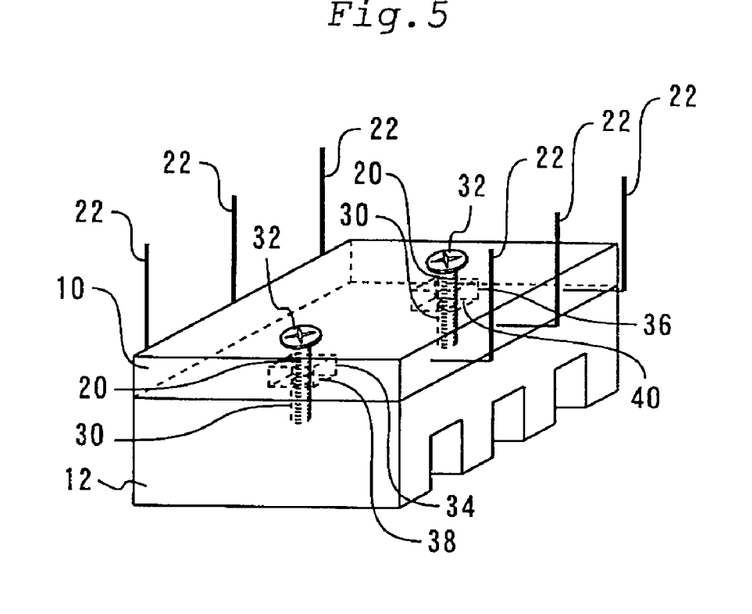
FIG. 5 is a perspective view of a semiconductor device according to a second embodiment.
Figure 6:
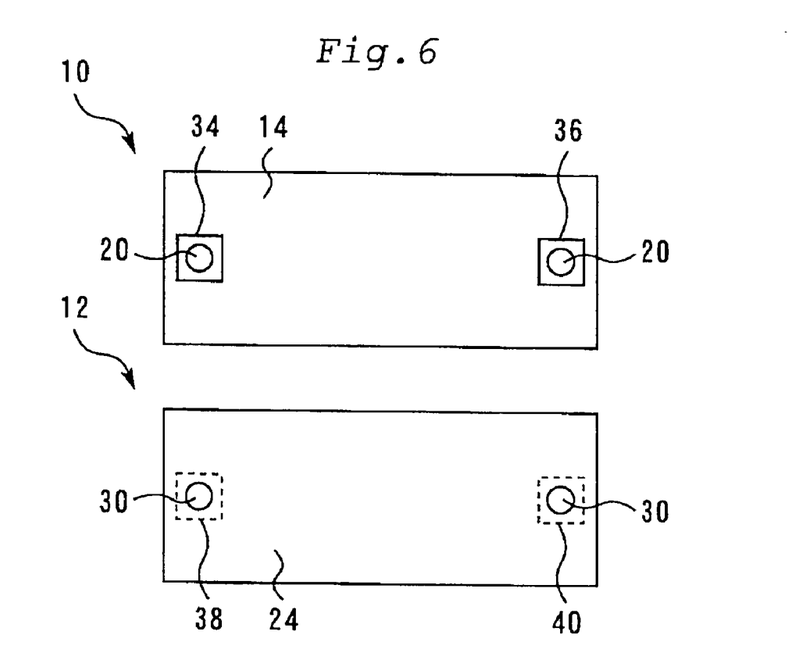
FIG. 6 is a plan view of joint surfaces of a semiconductor module and a radiating fin according to a second embodiment.
Figure 7:
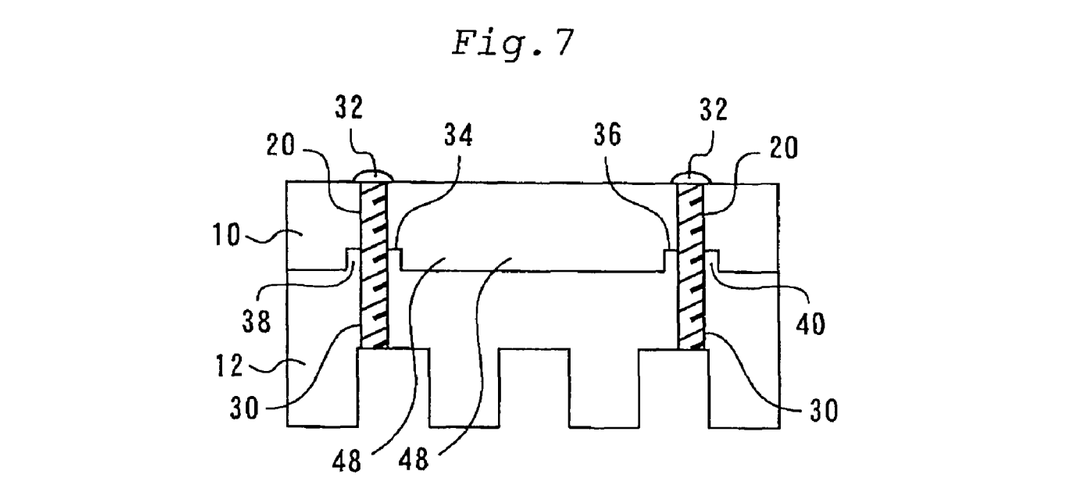
FIG. 7 is a cross-sectional view of a fitting portion of a semiconductor module and a radiating fin according to a second embodiment.

A configuration of a semiconductor device according to a second embodiment will now be described. FIG. 5 is a perspective view of a semiconductor device according to the second embodiment. FIG. 6 is a plan view of joint surfaces of a semiconductor module and a radiating fin according to the second embodiment. FIG. 7 is a cross-sectional view of a fitting portion of a semiconductor module and a radiating fin according to the second embodiment.

The semiconductor device according to the present embodiment includes a semiconductor module 10 and a radiating fin 12. At both ends of the semiconductor module 10, screw holes 20 are provided. On a joint surface 14 of the semiconductor module 10, a first concave fitting portion (a first fitting portion) 34 and a second concave fitting portion (a second fitting portion) 36 are provided. The first concave fitting portion 34 and the second concave fitting portion 36 are larger than the screw hole 20, and the screw hole 20 lies inside each of these concaves. In both side faces of the semiconductor module 10, a plurality of leads 22 are provided.

On the other hand, at both ends of the radiating fin 12, screw holes 30 corresponding to the above-described screw holes 20 of the semiconductor module 10 are provided. A first convex fitting portion (a third fitting portion) 38 and a second convex fitting portion (a forth fitting portion) 40 are provided on the joint surface 24 of the radiating fin 12. The first convex fitting portion 38 and the second convex fitting portion 40 are larger than the screw hole 30, which lies inside each of these convexes.

In the semiconductor device according to the present embodiment, the semiconductor module 10 is bonded to the radiating fin 12 so that the first concave fitting portion 34 and the second concave fitting portion 36 of the semiconductor module 10 are fitted into the first convex fitting portion 38 and the second convex fitting portion 40 of the radiating fin 12, respectively. Silicone grease (not shown) is applied to the joint surface 24 of the radiating fin 12, the semiconductor module 10 is adhered to the radiating fin 12 with silicone grease.

Additionally, the semiconductor module 10 is fixed to the radiating fin 12 by tightening the screw 32 penetrating both the screw hole 20 of the first concave fitting portion 34 and the screw hole 30 of the first convex fitting portion 38, and the screw 32 penetrating both the screw hole 20 of the second concave fitting portion 36 and the screw hole 30 of the second convex fitting portion 40.

A method for manufacturing a semiconductor device according to the second embodiment will now be described. First, as shown in FIG. 6, a semiconductor module 10 that has a joint surface 14 is manufactured, a first concave fitting portion (a first fitting portion) 34 and a second concave fitting portion (a second fitting portion) 36 are provided on the joint surface 14. Then, a radiating fin 12 that has a joint surface 24 is manufactured. A first convex fitting portion (a third fitting portion) 38 and a second convex fitting portion (a forth fitting portion) 40 are provided on the joint surface 24.

Next, Silicon grease (not shown) is applied to the joint surface 24 of the radiating fin 12. Next, as shown in FIG. 7, the semiconductor module 10 is bonded to the radiating fin 12 so that the first concave fitting portion 34 and the second concave fitting portion 36 are fitted into the first convex fitting portion 38 and the second convex fitting portion 40, respectively. Thereby the semiconductor module 10 is adhered to the radiating fin 12 with silicone grease.

Next, the screw 32 penetrating both the screw hole 20 of the first concave fitting portion 34 and the screw hole 30 of the first convex fitting portion 38, and the screw 32 penetrating both the screw hole 20 of the second concave fitting portion 36 and the screw hole 30 of the second convex fitting portion 40 are tightened. Thereby the semiconductor module 10 is fixed to the radiating fin 12.

Figure 8:
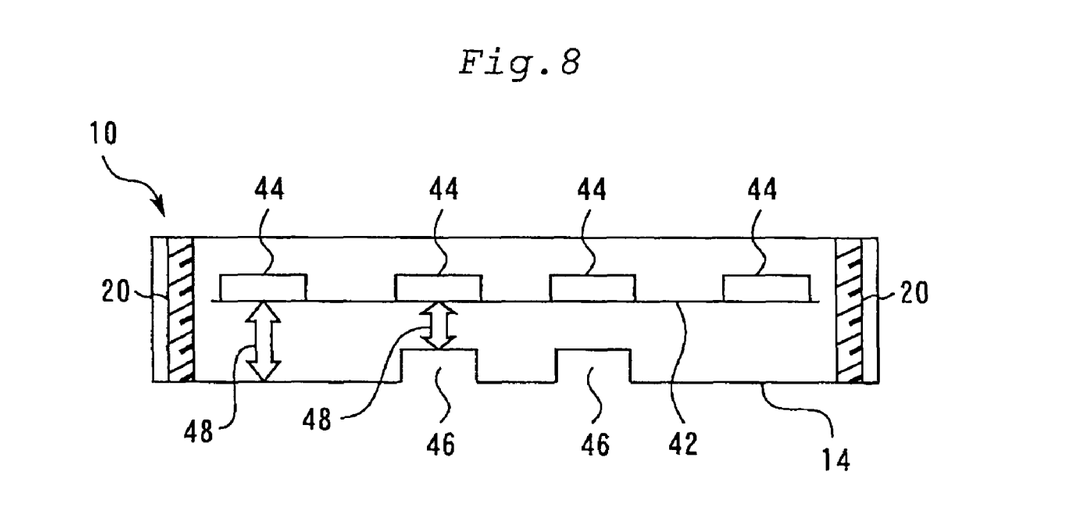
FIG. 8 is a cross-sectional view showing a semiconductor module according to a comparative example, so as to include a fitting portion.

Advantages of the present embodiment will now be described by comparing it with a comparative example. FIG. 8 is a cross-sectional view of a semiconductor module according to a comparative example, being described so as to include a fitting portion.

In the joint surface 14 of the semiconductor module 10 according to the comparative example, a concave fitting portion 46 is provided under a semiconductor element (IGBT (FWD)) 44 that is mounted on a frame 42 placed inside the semiconductor module 10. Thereby a insulating layer 48 of the semiconductor module 10 gets thinner under the semiconductor element 44. This causes to a reduction in the dielectric strength of the semiconductor module 10.

On the other hand, in the semiconductor device according to the present embodiment, the first concave fitting portion 34 and the second concave fitting portion 36 is provided on the position of the screw hole 20 needed to fix the semiconductor module 10. Thereby the insulating layer 48 of the semiconductor module 10 couldn't get thinner under the semiconductor element 44. This prevents a reduction in the dielectric strength of the semiconductor module 10.

In the present embodiment, when the semiconductor module 10 is fixed to the radiating fin 12, the screw 32 is tightened while the fitting portions of the semiconductor module 10 are fitted into the fitting portions of the radiating fin 12. This prevents, as same as in the first embodiment, the semiconductor module 10 from moving from the correct position to the radiating fin 12 when the semiconductor module 10 is fixed to the radiating fin 12.

Third Embodiment

Figure 9:
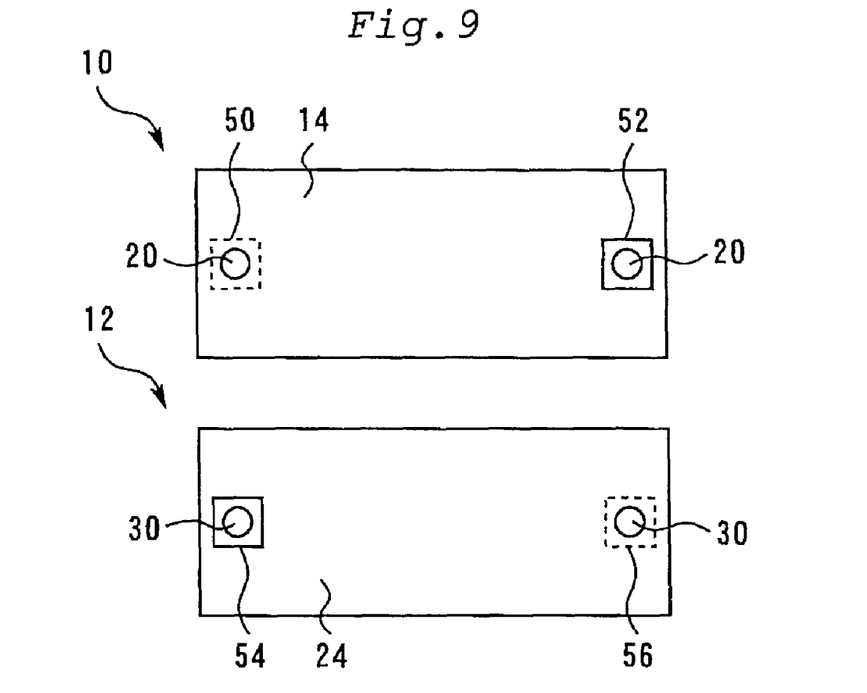
FIG. 9 is a plan view of joint surfaces of a semiconductor module and a radiating fin according to a third embodiment.
Figure 10:
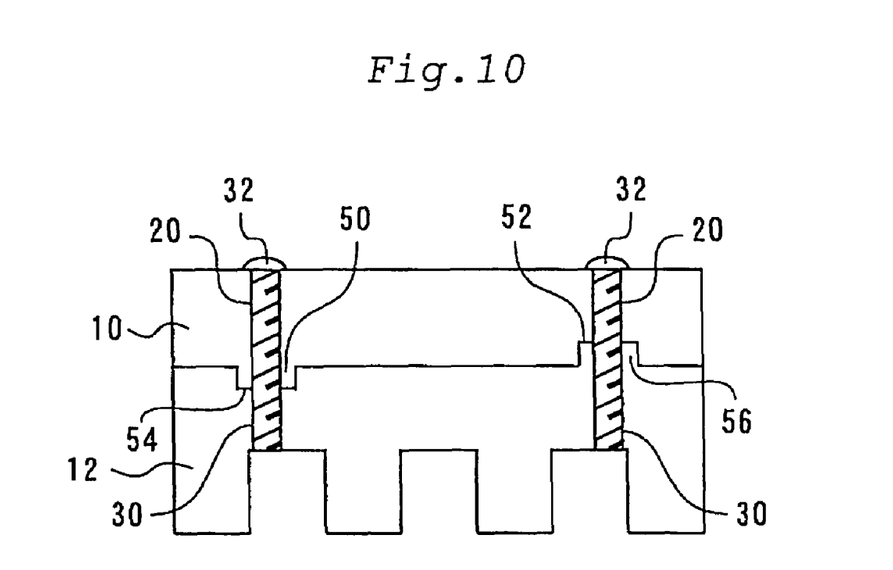
FIG. 10 is a cross-sectional view of a fitting portion of a semiconductor module and a radiating fin according to a third embodiment.

A configuration of a semiconductor device according to a third embodiment will now be described with respect only to a point of difference from the second embodiment. FIG. 9 is a plan view of joint surfaces of a semiconductor module and a radiating fin according to the third embodiment. FIG. 10 is a cross-sectional view of a fitting portion of a semiconductor module and a radiating fin according to the third embodiment.

On a joint surface 14 of a semiconductor module 10, a convex fitting portion (a first fitting portion) 50 and a concave fitting portion (a second fitting portion) 52 are provided. On the other hand, on a joint surface 24 of a radiating fin 12, a concave fitting portion (a third fitting portion) 54 and a convex fitting portion (a forth fitting portion) 56 are provided. The concave fitting portion 54 of the radiating fin 12 has a shape to fit into the convex fitting portion 50 of the semiconductor module 10, and not to fit into the concave fitting portion 52 of the semiconductor module 10. The convex fitting portion 56 of the radiating fin 12 has a shape to fit into the concave fitting portion 52 of the semiconductor module 10, and not to fit into the convex fitting portion 50 of the semiconductor module 10.

Therefore, when the semiconductor module 10 is fixed to the radiating fin 12, the convex fitting portion 50 of the semiconductor module 10 have to be fitted into the concave fitting portion 54 of the radiating fin 12 and the concave fitting portion 52 of the semiconductor module 10 have to be fitted into the convex fitting portion 56 of the radiating fin 12. This prevents the semiconductor module 10 from being fixed to the radiating fin 12 in a state where rotating 180 degrees with respect to the correct position.

In addition, a reduction in the dielectric strength of the semiconductor module 10 is prevented as same as in the second embodiment. Also, when the semiconductor module 10 is fixed to the radiating fin 12, the semiconductor module 10 is prevented from moving from the correct position on the radiating fin 12.

Fourth Embodiment

Figure 11:
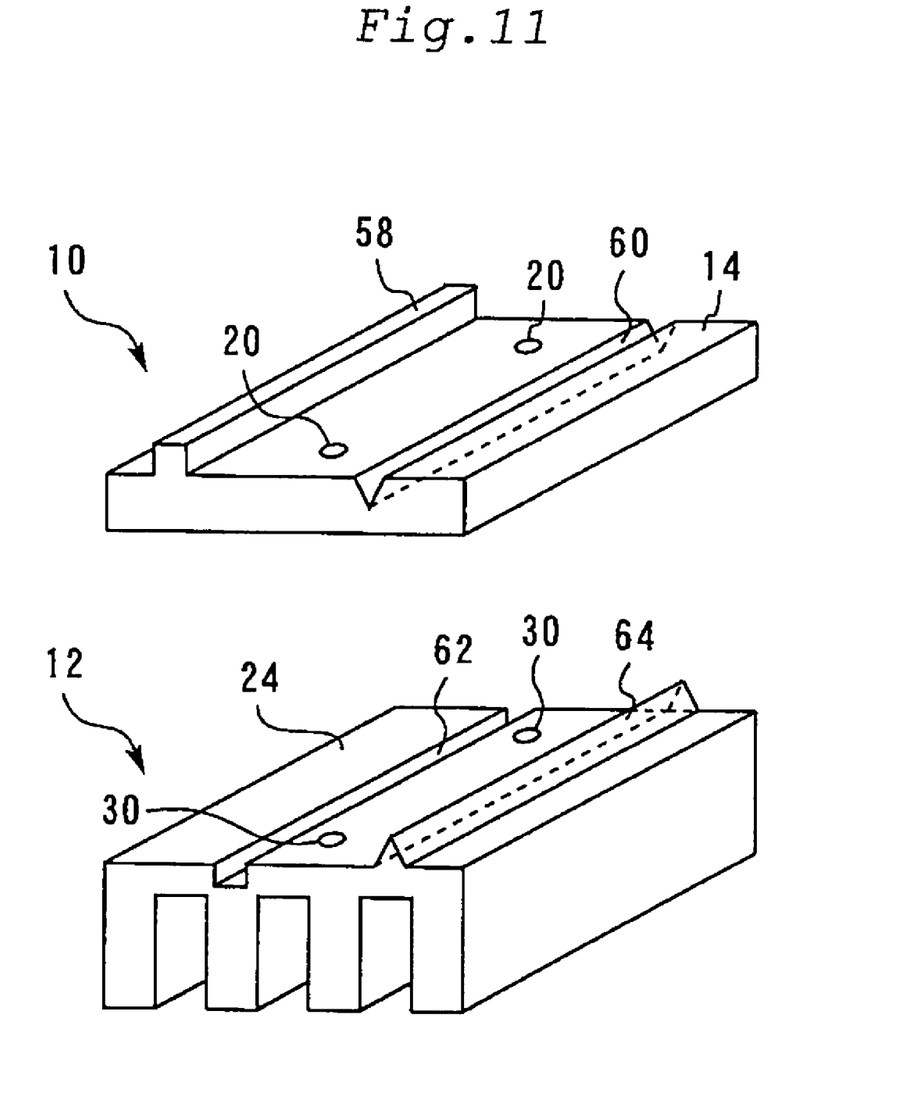
FIG. 11 is a perspective view of joint surfaces of a semiconductor module and a radiating fin according to a fourth embodiment.

A configuration of a semiconductor device according to a fourth embodiment will now be described with respect only to a point of difference from the first embodiment. FIG. 11 is a perspective view of joint surfaces of a semiconductor module and a radiating fin according to the fourth embodiment. In FIG. 11, the semiconductor module is shown so that the joint surface thereof directs upward, for easiness to view.

On a joint surface 14 of the semiconductor module 10, a first rail-like fitting portion (a first fitting portion) 58 and a second rail-like fitting portion (a second fitting portion) 60 are provided. The first rail-like fitting portion 58 extends from one end to the other end in the joint surface 14 while having a convex quadrangular cross-section surface. The second rail-like fitting portion 60 extends from one end to the other end in the joint surface 14 in the same manner while having a concave triangular cross-section surface.

On the other hand, on a joint surface 24 of the radiating fin 12, a third rail-like fitting portion (a third fitting portion) 62 and a forth rail-like fitting portion (a forth fitting portion) 64 are provided. The third rail-like fitting portion 62 extends from one end to the other end in the joint surface 24 while having a concave quadrangular cross-section surface. The forth rail-like fitting portion 64 extends from one end to the other end in the joint surface 24 in the same manner while having a convex triangular cross-section surface. The third rail-like fitting portion 62 has a shape to fit into the first rail-like fitting portion 58 of the semiconductor module 10. The forth rail-like fitting portion 64 has a shape to fit into the second rail-like fitting portion 60 of the semiconductor module 10.

Therefore, the fitting portions of both the semiconductor module 10 and the radiating fin 12 come into contact with each other over a large area, compared with those in the first embodiment. Thereby, when the semiconductor module 10 is fixed to the radiating fin 12, the semiconductor module 10 is prevented from moving from the correct position on the radiating fin 12 more certainly, compared with that in the first embodiment.

In addition, as same as in the first embodiment, the semiconductor module 10 is prevented from being fixed to the radiating fin 12 in a state where rotating 180 degrees with respect to the correct position. Also, when the semiconductor module 10 is fixed to the radiating fin 12, the semiconductor module 10 is prevented from moving from the correct position.

The major benefits of the present invention described above are summarized follows:

According to one aspect of the present invention, a semiconductor module is prevented from being fixed to a radiating fin in a state where rotating 180 degrees with respect to the correct position. According to another aspect of the present invention, a reduction in the dielectric strength of the semiconductor module is prevented.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2009-77041, filed on Mar. 26, 2009 including specification, claims, drawings and summary, on which the Convention priority of the present application is based, are incorporated herein by reference in its entirety.

What is claimed is:

1. A semiconductor device, comprising:
   a semiconductor module that has a joint surface, a first fitting portion and a second fitting portion provided on the joint surface of the semiconductor module, the second fitting portion having a shape different from the first fitting portion; and
   a radiating fin that has a joint surface, a third fitting portion and a fourth fitting portion provided on the joint surface of the radiating fin, the fourth fitting portion having a shape different from the third fitting portion;
   wherein the semiconductor module is bonded to the radiating fin so that the first fitting portion is fitted into the third fitting portion or the third fitting portion is fitted into the first fitting portion, and the second fitting portion is fitted into the fourth fitting portion or the fourth fitting portion is fitted into the second fitting portion;
   the semiconductor module is fixed to the radiating fin by a screw penetrating the joint surfaces of the semiconductor module and the radiating fin;
   the first fitting portion has a shape not to fit into the fourth fitting portion and the fourth fitting portion has a shape not to fit into the first fitting portion; and
   the second fitting portion has a shape not to fit into the third fitting portion and the third fitting portion has a shape not to fit into the second fitting portion.

2. A semiconductor device, comprising:
   a semiconductor module that has a joint surface, a first fitting portion and a second fitting portion provided on the joint surface of the semiconductor module; and
   a radiating fin that has a joint surface, a third fitting portion and a fourth fitting portion provided on the joint surface of the radiating fin;
   wherein the semiconductor module is bonded to the radiating fin so that the first fitting portion is fitted into the third fitting portion or the third fitting portion is fitted into the first fitting portion, and the second fitting portion is fitted into the fourth fitting portion or the fourth fitting portion is fitted into the second fitting portion;
   the first fitting portion has a shape not to fit into the fourth fitting portion and the fourth fitting portion has a shape not to fit into the first fitting portion;
   the second fitting portion has a shape not to fit into the third fitting portion and the third fitting portion has a shape not to fit into the second fitting portion; and
   the semiconductor module is fixed to the radiating fin by a screw penetrating joint surfaces of the first fitting portion and the third fitting portion, and a screw penetrating joint surfaces of the second fitting portion and the fourth fitting portion.

3. The semiconductor device according to claim 2, wherein the second fitting portion has a shape different from the first fitting portion; and
   the fourth fitting portion has a shape different from the third fitting portion.

4. The semiconductor device according to claim 1, wherein the first fitting portion, the second fitting portion, the third fitting portion, and the fourth fitting portion have a rail-like shape, respectively.

5. The semiconductor device according to claim 2, wherein the first fitting portion, the second fitting portion, the third fitting portion, and the fourth fitting portion have a rail-like shape, respectively.

6. The semiconductor device according to claim 3, wherein the first fitting portion, the second fitting portion, the third fitting portion, and the fourth fitting portion have a rail-like shape, respectively.

7. A method for manufacturing a semiconductor device, comprising:
   manufacturing a semiconductor module that has a joint surface, a first fitting portion and a second fitting portion provided on the joint surface of the semiconductor module, the second fitting portion having a shape different the first fitting portion;
   manufacturing a radiating fin that has a joint surface, a third fitting portion and a fourth fitting portion provided on the joint surface of the radiating fin, the fourth fitting portion having a shape different from the third fitting portion;
   bonding the semiconductor module to the radiating fin so that the first fitting portion is fitted into the third fitting portion or the third fitting portion is fitted into the first fitting portion, and the second fitting portion is fitted into the fourth fitting portion or the fourth fitting portion is fitted into the second fitting portion; and
   fixing the semiconductor module to the radiating fin by driving a screw penetrating the joint surfaces of the semiconductor module and the radiating fin after bonding the semiconductor module to the radiating fin;
   wherein the first fitting portion is formed into a shape not to fit into the fourth fitting portion and the fourth fitting portion is formed into a shape not to fit into the first fitting portion; and
   the second fitting portion is formed into a shape not to fit into the third fitting portion and the third fitting portion is formed into a shape not to fit into the second fitting portion.

8. A method for manufacturing a semiconductor device, comprising:
   manufacturing a semiconductor module that has a joint surface, a first fitting portion and a second fitting portion provided on the joint surface of the semiconductor module;
   manufacturing a radiating fin that has a joint surface, a third fitting portion and a fourth fitting portion provided on the joint surface of the radiating fin, the first fitting portion formed into a shape not to fit into the fourth fitting portion, the second fitting portion formed into a shape not to fit into the third fitting portion, the third fitting portion formed into a shape not to fit into the second fitting portion, the fourth fitting portion formed into a shape not to fit into the first fitting portion;
   bonding the semiconductor module to the radiating fin so that the first fitting portion is fitted into the third fitting portion or the third fitting portion is fitted into the first fitting portion, and the second fitting portion is fitted into the fourth fitting portion or the fourth fitting portion is fitted into the second fitting portion; and
   fixing the semiconductor module to the radiating fin by driving a screw penetrating joint surfaces of the first fitting portion and the third fitting portion, and a screw penetrating joint surfaces of the second fitting portion and the fourth fitting portion after bonding the semiconductor module to the radiating fin.

9. The method for manufacturing according to claim 8, wherein the second fitting portion is formed into a shape different from the first fitting portion; and
   the fourth fitting portion is formed into a shape different from the third fitting portion.

10. The method for manufacturing according to claim 7, wherein the first fitting portion, the second fitting portion, the third fitting portion, and the fourth fitting portion are formed into a rail-like shape, respectively.

11. The method for manufacturing according to claim 8, wherein the first fitting portion, the second fitting portion, the third fitting portion, and the fourth fitting portion are formed into a rail-like shape, respectively.

12. The method for manufacturing according to claim 9, wherein the first fitting portion, the second fitting portion, the third fitting portion, and the fourth fitting portion are formed into a rail-like shape, respectively.

13. The semiconductor device according to claim 2, wherein the first fitting portion is nearest an edge of the joint surface of the semiconductor module opposing an edge of the joint surface of the semiconductor module nearest the second fitting portion, relative to the center of the joint surface of the semiconductor module.

* * * * *

UNITED STATES PATENT AND TRADEMARK OFFICE
CERTIFICATE OF CORRECTION

PATENT NO. : 8,338,944 B2
APPLICATION NO. : 12/623731
DATED : December 25, 2012
INVENTOR(S) : Takuya Shiraishi It is certified that error appears in the above-identified patent and that said Letters Patent is hereby corrected as shown below:

Please change the Title of the Invention on the front page, Item (54) and in the Specification, Column 1, lines 1-3 from "SEMICONDUCTOR DEVICE, SEMICONDUCTOR MODULE, RADIATING FIN AND FITTING PORTIONS"

to -- SEMICONDUCTOR DEVICE AND METHOD FOR MANUFACTURING THE SAME --

Signed and Sealed this
Thirtieth Day of April, 2013

Teresa Stanek Rea
*Acting Director of the United States Patent and Trademark Office*